US007508006B2

(12) United States Patent
Hsu

(10) Patent No.: US 7,508,006 B2
(45) Date of Patent: Mar. 24, 2009

(54) CIRCUIT BOARD STRUCTURE OF INTEGRATED OPTOELECTRONIC COMPONENT

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 301 days.

(21) Appl. No.: 11/467,302

(22) Filed: Aug. 25, 2006

(65) Prior Publication Data
US 2007/0086695 A1 Apr. 19, 2007

(30) Foreign Application Priority Data
Oct. 13, 2005 (TW) .............................. 94135637 A

(51) Int. Cl.
*H01L 33/00* (2006.01)
*G02B 6/12* (2006.01)
(52) U.S. Cl. .................. 257/98; 257/432; 257/700; 257/724; 257/758; 385/14
(58) Field of Classification Search ....................... None
See application file for complete search history.

(56) References Cited

U.S. PATENT DOCUMENTS 6,839,476 B2 1/2005 Kim et al.
7,302,126 B2 * 11/2007 Hsu .............................. 385/14
7,313,294 B2 * 12/2007 Hsu .............................. 385/14
7,359,590 B2 * 4/2008 Hsu .............................. 385/14

FOREIGN PATENT DOCUMENTS

JP       2000081524 A   *  3/2000
JP       2002329891 A   *  11/2002

* cited by examiner

*Primary Examiner*—Alonzo Chambliss
(74) *Attorney, Agent, or Firm*—Foley & Lardner LLP

(57) ABSTRACT

A circuit board structure of an optoelectronic component is proposed. A supporting structure has a first surface and a second surface. At least one optical transceiver has an active surface and an inactive surface. The inactive surface of the optical transceiver is mounted on the first surface of the supporting structure, and the active surface of the optical transceiver has an optical active region and a plurality of electrode pads. A dielectric layer is formed on the first surface of the supporting structure and the active surface of the optical transceiver. A circuit layer is formed on the dielectric layer and is electrically connected to the electrode pads on the active surface of the optical transceiver through the conductive structure in the dielectric layer. At least one hole, which penetrates the dielectric layer, is used to expose the optical active region on the active surface of the optical transceiver. Therefore, the transmission quality of the optical transceiver is improved and the dimension of the circuit board structure is shrunken.

22 Claims, 7 Drawing Sheets

CIRCUIT BOARD STRUCTURE OF INTEGRATED OPTOELECTRONIC COMPONENT

FIELD OF THE INVENTION

The present invention is related to circuit board structures of integrated optoelectronic component, and more particularly, to a circuit board structure that has been integrated with optical transmitting and receiving components and circuit structures.

BACKGROUND OF THE INVENTION

As the technological development of semiconductors advances, demands for miniaturized packaging and larger data storage capacity have also intensified along the way. In addition to that, because the data processing capacity is constantly increasing, if data units of the same size can be processed at the fastest speed possible in a given unit of time, then data can be processed more efficiently. The most straightforward method for raising the processing speed of semiconductors is to increase its operating frequency, but when the data transfer rate exceeds one gigabyte per second, problems like heat dissipation caused by high wattage, signal time delay, and electromagnetic interference (EMI) also arise, which will impede the production of semiconductors with high performance. This problem has been made even more severe because the traditional medium for data signal transmission is copper circuit, which cannot achieve higher conductivity due to its intrinsically limited conducting property, thus its signal transmission rate cannot be elevated by the method of increasing its conductivity.

Moreover, the signal transmission structure made of metal circuits is more susceptible to the interference of external noises or internal circuits during signal transmission, which in turn leads to erroneous signals being transferred. Therefore, the signal transmission structure has to be equipped with adequate protective measures to prevent the interference mentioned above from affecting signals, and this phenomenon is especially obvious in high-frequency signal transmission. The protective measures will result in increased difficulty to the designs of circuit and additional structures, which will in turn raise the costs of design and production, and cannot improve the current situation.

The traditional method of signal transmission is analog signal transmission, which works by charging conductor with electrical currents, but the current method for processing signals inside circuits is the digital processing method, which can easily distort signals when one type of signal is converted to the other during signal transmission.

In order to resolve the disadvantages resulted from the traditional method of analog signal transmission, the new technology uses optical signal to replace electrical signal for signal transmission, and the most obvious advantage by such change is better quality in signal transmission, since the optical signal is almost unsusceptible to interference of electromagnetic waves and is thus not distorted as much. As a result, there is no need to design a structure for preventing the interference of electromagnetic waves, and this helps reduce the costs of design and production. Therefore, using optical signal for signal transmission has become the main aim for future development.

In the prior arts, the optical transmission structure is designed to be disposed inside the printed circuit board; the process begins by adding a layer of optical conductive layer with organic waveguide film into the printed circuit board, then followed by the integration and packaging of optoelectronic and driving components onto the circuit board; the optical conductive layer can serve as the pathway for optical signal transmission, thereby achieving the aim of high-speed transfer. FIG. 1 shows the invention of U.S. Pat. No. 6,839,476, wherein a core layer 12 is formed on the bottom layer 11, and a plurality of grooves 12a are also formed on core layer 12; an optical fiber 13 is disposed into groove 12a, followed by the formation of a top layer 14 on top of core layer 12, so that optical fiber 13 is embedded within core layer 12; optical fiber 13 is made by enclosing a layer of cladding 13b around a core 13a. The two ends of optical fiber 13 can be fitted with optical transmitting and receiving modules, along with passive optical components, so that the disadvantages of electrical signal transmission can be avoided by sending optical signal via optical fiber 13.

However, because optical fiber 13 needs to be embedded in groove 12a of core layer 12, the core layer 12 has to undergo the grooving process in prior to the above step, followed by the disposition of optical fiber 13 into groove 12a to complete the overall production process. But the disposition of optical fiber 13 into groove 12a is carried out mechanically is similar to the mechanically process of electronic components inserted into the circuit board. As a result, the speed of production is slower and cannot reach the goal of fast production.

Moreover, optical fiber 13 needs to be cut in accordance with the length of groove 12a that it faces beforehand, so that it can then be disposed into groove 12a; this adds an additional step in the overall production process, and hence raises the difficulty of the production process. On the other hand, the uneven length of optical fiber 13 also makes the classification step in the production process more complicated, thereby increasing overall production steps and raising its complication, which in turn results in increased production costs.

Because grooves 12a has to be formed on core layer 12 in order to accept optical fiber 13, it is necessary to leave adequate interval spaces between each of the groove 12a while designing their size, so that optical fiber 13 can be disposed into core layer 12. But under the double influences of the size of interval space and the diameter of optical fiber 13, the optical fiber 13 layout density cannot be elevated.

Furthermore, the optical fiber 13 used to transfer optical signal is made by enclosing a layer of cladding 13b around a core 13a, wherein the inner layer of cladding 13b can serve as a reflecting surface that allows the optical signals to be reflected forwardly and thereby achieving the goal of transmitting signals. On the other hand, optical fiber 13 and circuit board are two different structures and need to be produced independently; afterwards, the two separately produced products also needs to be integrated. Both steps described above increase the difficulty of the overall production process; impede the attainment of mass production, and thus the production cost cannot be lowered further.

Because optical fiber 13 needs to be embedded with core layer 12, the difficulty and cost of the production are increased as a result; on the other hand, the demand of high optical fiber 13 layout density cannot be satisfied either, and all of the above issues require immediate attention and solution from the industry.

Therefore, it is urgent for the industry to provide a circuit board structure of integrated optoelectronic component that can meet the demand of miniaturization for electronic devices, reduce signal loss during signal transmission, shorten conductive pathway, decrease noises, and enhance the quality of optoelectronic signal transmission.

SUMMARY OF THE INVENTION

Bearing the shortcomings of the prior arts in mind, the major objective of the present invention is to provide a circuit board structure of integrated optoelectronic component that can reduce signal loss during signal transmission, shorten conductive pathway, decrease noises, and enhance the quality of optoelectronic signal transmission.

Another objective of the present invention is to provide a circuit board structure of integrated optoelectronic component that can meet the demand of miniaturization of electronic devices.

A further objective of the present invention is to provide a circuit board structure of integrated optoelectronic component that has heat slug or heat dissipation board that can raise the overall heat dissipation efficiency of the circuit board.

To achieve the above and other objectives, the circuit board structure of integrated optoelectronic component is composed of: a supporting structure that has a first surface and a second surface; at least one optical transceiver that has an active surface and an inactive surface opposite to the active surface; the inactive surface of the optical transceiver is mounted on the supporting structure, and the active surface of the optical transceiver has an optical active region and a plurality of electrode pads; a dielectric layer that is formed on the first surface of the supporting structure and the active surface of the optical transceiver; a circuit layer that is formed on the dielectric layer and is electrically connected to the electrode pads on the active surface of the optical transceiver through the conductive structure in the dielectric layer; as well as at least one hole that penetrates the dielectric layer in order to expose the optical active region on the active surface of the optical transceiver.

The supporting structure can either be metal boards, ceramic boards, insulating boards, organic circuit boards, or the randomly stacked structure made of the previous materials; the organic circuit board can be a printed circuit board or an IC package substrate.

The optical transceiver can either be laser diode (LD), light emitting diode (LED), vertical cavity surface emitting laser (VCSEL), photodiode (PD) or photo sensor.

The circuit board structure of integrated optoelectronic component described above is further comprised of a semiconductor component that is either an active component or a passive component, and the semiconductor component is disposed in the opening of the supporting structure, so that the circuit layer is electrically connected to the semiconductor component by the conductive structure formed in the dielectric layer.

In addition to that, an insulating protective layer is formed on the circuit layer, and a plurality of openings are formed in the insulating protective layer to expose the parts of the circuit layer that serve as electrical connecting pads, while another optical transceiver is disposed on the electrical connecting pad of the circuit board, so that the optical transceiver is electrically connected to the electrical connecting pad; the optical active region on the active surface of another optical transceiver is opposite to the dielectric layer and the hole of the insulating protective layer, so that the optical transceivers can transmit optical signal directly.

Moreover, a built-up circuit layer structure that is electrically connected to the circuit layer can be further formed on the circuit layer, and at least one through hole can be formed in the dielectric layer and the built-up circuit layer structure to expose the optical active region on the active surface of the optical transceiver. Additionally, an insulating protective layer can also be formed on the outer surface of the built-up circuit layer structure, so that the circuits located on the outer surface of the built-up circuit layer structure are protected. The insulating protective layer also possess a plurality of openings that are used to expose the electrical connecting pads located on the outer surface of the built-up circuit layer structure, and another optical transceiver is disposed on and electrically connected to the electrical connecting pads, so that through holes are formed in the dielectric layer and the built-up circuit layer structure, and the through holes are opposite to the optical active region on the active surface of another optical transceiver, and the optical transceivers can transmit and receive optical signal directly as a result.

Therefore, according to the present invention, the circuit board structure of integrated optoelectronic component is mainly consisted of a supporting structure and the optical transceiver thereof, and a single-layer or a multi-layer circuit structure that possess optical transceivers with holes on their active surfaces, so that the circuits in the single-layer or multi-layer circuit structure can be electrically connected to the electrode pads of the optical transceivers directly, and the optical active region of the optical transceivers is made face the position of the holes, thereby giving rise to the circuit board structure that meet the demand of miniaturization for electronic devices. On the other hand, the integration of the optoelectronic components also reduces signal loss during signal transmission, shortens the conductive pathway, and decreases noises, thereby enhancing the quality of optoelectronic signal transmission.

Furthermore, in the circuit board structure of integrated optoelectronic component in accordance with the present invention, the two ends of a hole in the single-layer or multi-layer circuit structure can be connected to an optical transceiver, thereby making the optical active regions on the active surfaces of the two optical transceivers face each other, thereby forming a modularized circuit board structure integrated with optoelectronic components, which in turn satisfies the constantly rising demands regarding the quality of electronic products.

Furthermore, in the circuit board structure of integrated optoelectronic component in accordance with the present invention, the supporting structure is composed of a first and a second supporting board, and the first and the second supporting boards can either be metal boards, ceramic boards, insulating boards, organic circuit boards, or the randomly stacked structure made of the previous materials; the organic circuit board can be a printed circuit board or an IC package substrate.

In addition, a heat slug can be formed in the supporting structure or the second supporting board described before, so as to connect to the optical transceiver or the semiconductor component, so that the heat generated from running the optical transceiver or the semiconductor component can be directly dispelled outwards. As a result, the heat dissipation efficiency of the circuit board structure of integrated optoelectronic component can be elevated, thereby protecting the components from being damaged.

The circuit board structure of integrated optoelectronic component of the present invention can also be disposed with organic circuit boards, so that other electronic components can be connected to the circuit board and thereby raising its electrical functionality.

BRIEF DESCRIPTION OF THE DRAWINGS

The present invention can be more fully comprehended by reading the detailed description of the preferred embodiments listed below, with reference made to the accompanying drawings, wherein.

DETAILED DESCRIPTION OF THE PREFERRED EMBODIMENTS

The invention has been described using exemplary preferred embodiments; anyone who is familiar with the arts can easily comprehend other advantages and effects of the present invention by reading the disclosed content in this claim. Moreover, the present invention can also be implemented or applied by using other embodiments, and anyone can modify and adjust the details in this claim on the basis of different considerations or applications, provided that he or she does not depart from the purpose and scope of the present invention.

The First Preferred Embodiment

Figure 1:
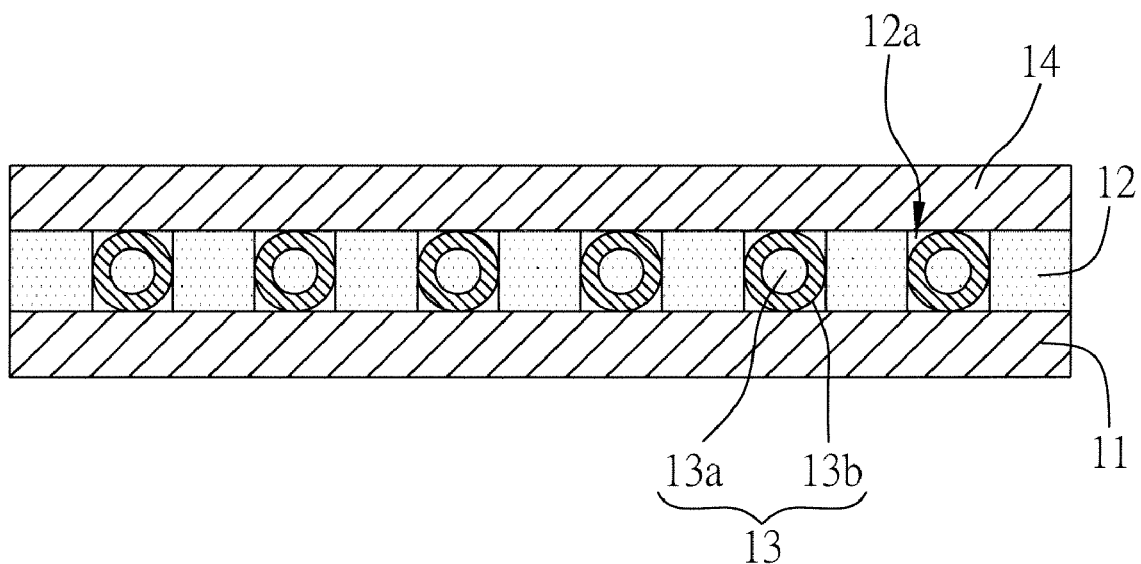
FIG. 1 is a cross-sectional view showing the invention of U.S. Pat. No. 6,839,476.
Figure 2A:
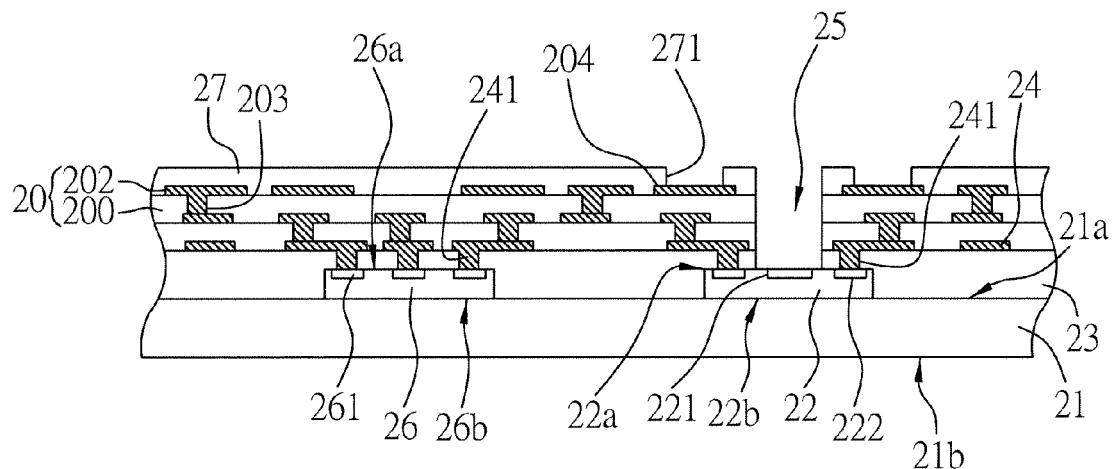
FIGS. 2A and 2B are schematic cross-sectional views illustrating the circuit board structure of integrated optoelectronic component of the present invention according to the first embodiment of the present invention.
Figure 2B:
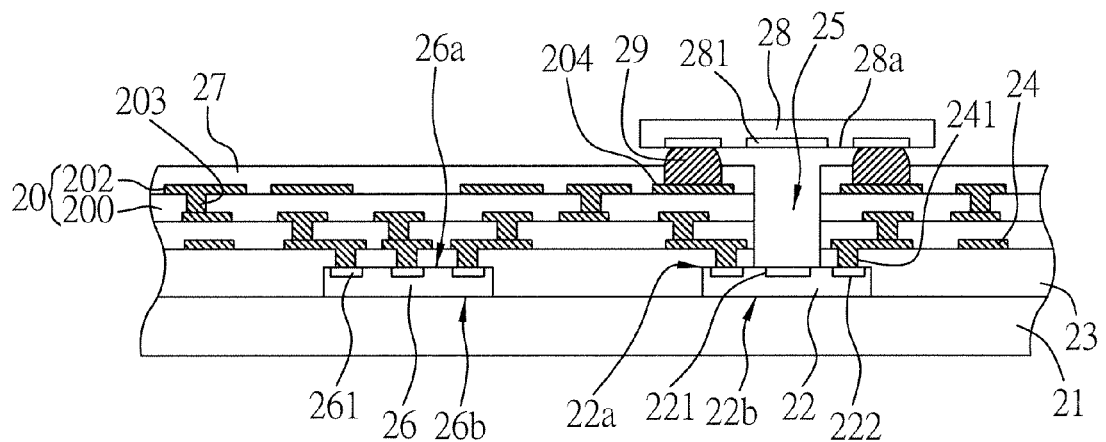

FIGS. 2A and 2B show the cross-sectional views of the circuit board structure of integrated optoelectronic component of the present invention according to the first embodiment of the present invention.

As shown in FIG. 2A, the circuit board structure of integrated optoelectronic component in this embodiment is composed of: a supporting structure 21 that has a first surface 21a and a second surface 21b opposite to the first surface; an optical transceiver 22 that has at least one active surface 22a and an inactive surface 22b opposite to 22a; the inactive surface 22b of optical transceiver 22 is disposed on the first surface 21a of supporting structure 21, an optical active region 221 and a plurality of electrode pads 222 are formed on active surface 22a of optical transceiver 22; a dielectric layer 23 that is formed on the first surface 21a of supporting structure 21 and on active surface 22a of optical transceiver 22; a circuit layer 24 that is formed on the surface of dielectric layer 23, and circuit layer 24 is electrically connected to the electrode pads 222 on active surface 22a of optical transceiver 22 by the conductive structure 241 formed in dielectric layer 23; as well as a hole 25 that penetrates dielectric layer 23.

The supporting structure 21 can either be metal boards, ceramic boards, insulating boards, organic circuit boards, or the randomly stacked structure made of the previous materials; in addition, the surface of supporting structure 21 can be further disposed with a semiconductor component 26 such as an active component or a passive component; dielectric layer 23 and circuit layer 24 can be formed on the surface of supporting structure 21, on the active surface 22a of optical transceiver 22, and on the active surface 26a of semiconductor component 26, and circuit layer 24 is electrically connected to the electrode pads 222 on active surface 22a of optical transceiver 22, as well as to the electrode pads 261 on active surface 26a of semiconductor component 26 by the conductive structure 241 formed in dielectric layer 23.

The optical transceiver 22 is disposed on the first surface 21a of supporting structure 21, and an optical active region 221 and a plurality of electrode pads 222 are formed on active surface 22a of optical transceiver 22, wherein the optical transceiver is either LD, LED, VCSEL, PD or photo sensor.

The dielectric layer 23 is formed on the first surface 21a of supporting structure 21 and on active surface 22a of optical transceiver 22, and the dielectric layer 23 can be made of photosensitive or non-photosensitive resins like ABF (Ajinomoto Build-up Film), BCB (Benzocyclo-buthene), ICP (liquid Crystal Polymer), PI (Poly-imide), PPE (Poly(phenylene ether)), PTFE (Poly(tetra-fluoroethylene)), FR4, FR5, BT (Bismaleimide Triazine), Aramide; or made of substances mixed with epoxy resin and glass fiber.

An additional built-up circuit layer structure 20 can be formed on the surface of dielectric layer 23 and circuit layer 24, in which hole 25 penetrates the positions of dielectric layer 23 and built-up circuit layer structure 20 that are opposite to optical active region 221 on active surface 22a of optical transceiver 22, so that optical active region 221 is exposed and thereby allowing optical transceiver 22 to transmit optical signal.

The built-up circuit layer structure 20 is consisted of: a dielectric layer 200, a circuit layer 202 formed on the surface of dielectric layer 200, and a conductive structure 203 formed in dielectric layer 200 that allows circuit layer 202 to electrically connect to circuit layer 24. A plurality of electrical connecting pads 204 are formed on the circuit layer on the outer surface of built-up circuit layer structure 20, wherein hole 25 penetrates the positions of dielectric layer 23 and built-up circuit layer structure 20 that are opposite to optical active region 221 on active surface 22a of optical transceiver 22, so that optical active region 221 of optical transceiver 22 is exposed.

An insulating protective layer 27 can be further formed on the outer surface of the built-up circuit layer structure 20 described above in order to protect the circuit layer underneath it, and a plurality of openings 271 are formed in insulating protective layer 27 to expose the electrical connecting pads 204 on the outer surface of the built-up circuit layer structure.

Referring to FIG. 2B, the circuit board structure of integrated optoelectronic component of the present invention can further comprise another optical transceiver 28 formed on the surface of the built-up circuit layer structure 20, and optical transceiver 28 is disposed on electrical connecting pad 204 of built-up circuit layer structure 20 by conductive element 29; the optical active region 281 on active surface 28a of optical transceiver 28 is opposite to hole 25, hence it is facing optical active region 221 of optical transceiver 22, so that the signals from optical transceivers 22 and 28 can be directly transmitted and received, thereby raising the electrical functionality of the circuit board structure.

The hole 25 can be filled with air or optical conductive material to prevent external noises from interfering with the transmission of optical signal, and to protect optical active region 221 of optical transceiver 22.

The Second Preferred Embodiment

Figure 3:
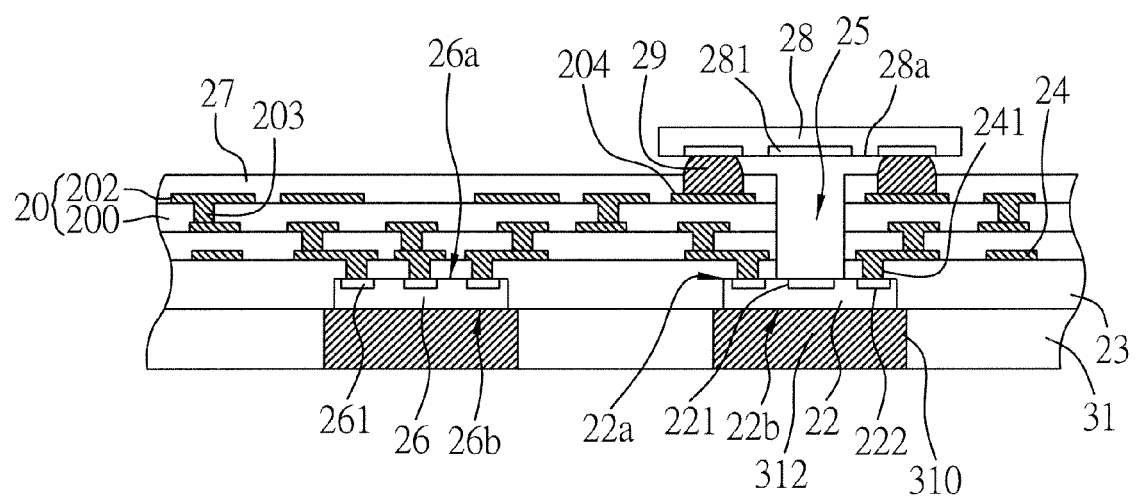
FIG. 3 is a cross-sectional view showing the circuit board structure of integrated optoelectronic component of the present invention according to the second embodiment of the present invention.

FIG. 3 is a cross-sectional view showing the circuit board structure of integrated optoelectronic component of the present invention according to the second embodiment of the present invention; it differs from the previous embodiment in that the supporting structure 31 can be either a circuit board or an insulating board, and an opening 310 is formed in supporting structure 31, with a heat slug 312 formed in opening 310. The optical transceivers 22 and 28, as well as semiconductor component 26 are disposed on heat slug 312, so that the heat generated from running optical transceivers 22 and 28 or semiconductor component 26 can be dispelled outwards, thereby raising the heat dissipation function of the circuit board structure of integrated optoelectronic component and protecting the components from getting damaged.

The Third Preferred Embodiment

Figure 4A:
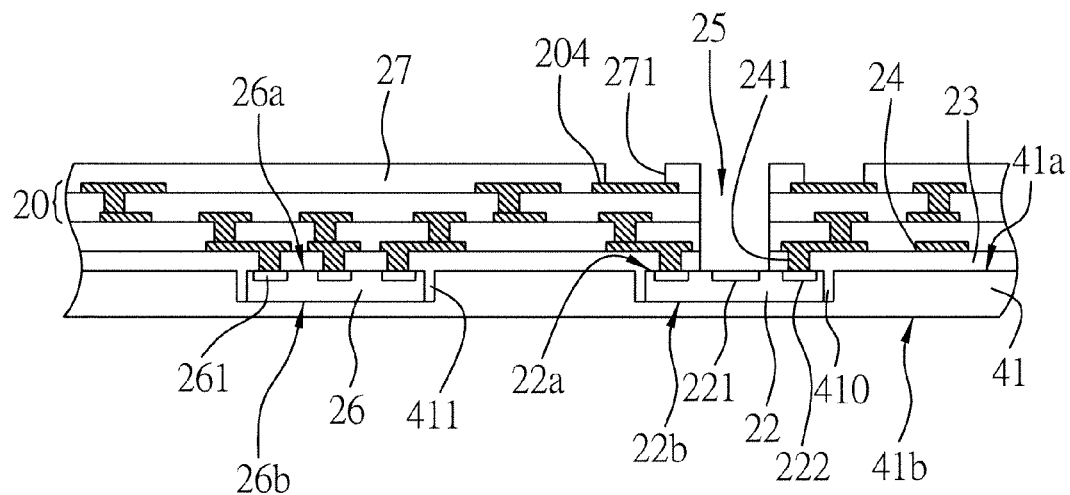
FIGS. 4A and 4B are schematic cross-sectional views illustrating the circuit board structure of integrated optoelectronic component of the present invention according to the third embodiment of the present invention.
Figure 4B:
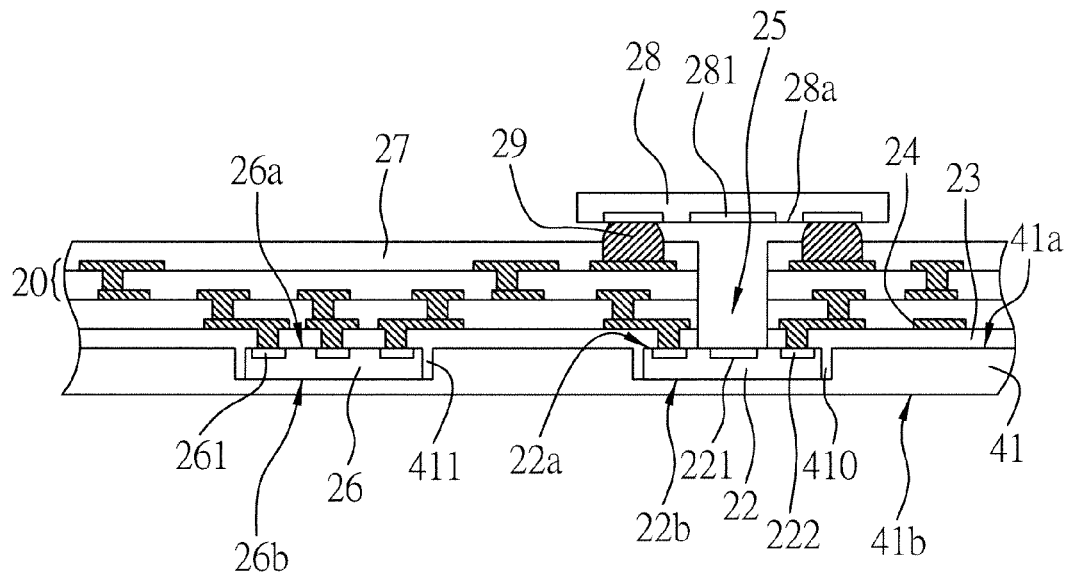

FIGS. 4A and 4B are schematic cross-sectional views illustrating the circuit board structure of integrated optoelectronic component of the present invention according to the third embodiment of the present invention.

As shown in FIG. 4A, the circuit board structure of integrated optoelectronic component in this embodiment is composed of: a supporting structure 41 that has a first surface 41a and a second surface 41b, the supporting structure 41 can either be metal boards, ceramic boards, insulating boards, organic circuit boards, or the randomly stacked structure made of the previous materials; an opening 410 that penetrates the first surface 41a but not the second surface 41b is formed in supporting structure 41; at least one optical transceiver 22 that has an active surface 22a and an inactive surface 22b opposite to 22a, and the inactive surface 22b of optical transceiver 22 is disposed in opening 410 of supporting structure 41 by an adhesive layer (not shown in the figure); at least a semiconductor component 26, which can be an active component or a passive component; the semiconductor component 26 can be formed in another opening 411 of supporting structure 41; the semiconductor component 26 has an active surface 26a and an inactive surface 26b opposite to 26a, and a plurality of electrode pads 261 are located on active surface 26a; a dielectric layer 23 that is formed on the first surface 41a of supporting structure 41, on active surface 22a of optical transceiver 22, and on active surface 26a of semiconductor component 26; a circuit layer 24 formed on the surface of dielectric layer 23, and circuit layer 24 is electrically connected to the electrode pads 222 on active surface 22a of optical transceiver 22 and to the electrode pads 261 on active surface 26a of semiconductor component 26 by the conductive structure 241 formed in dielectric layer 23; as well as a hole 25 that penetrates dielectric layer 23, so that optical active region 221 on active surface 22a of optical transceiver 22 is exposed, thereby enabling optical transceiver 22 to transmit optical signal.

A built-up circuit layer structure 20 can be further formed on the circuit layer 24 described above, the built-up circuit layer structure 20 is formed on the surface of dielectric layer 23 and circuit layer 24, and the built-up circuit layer structure 20 is electrically connected to circuit layer 24; an insulating protective layer 27 is formed on the surface of built-up circuit layer structure 20 in order to protect the circuit layer under its cover, a plurality of openings 271 are also formed in the insulating protective layer 27 to expose the parts of circuit layer that serve as electrical connecting pads 204. At least a through hole 25 is formed in dielectric layer 23 and built-up circuit layer structure 20 as well, in order to expose optical active region 221 on active surface 22a of optical transceiver 22.

Referring to FIG. 4B, an additional optical transceiver 28 is disposed on the surface of built-up circuit layer structure 20, and optical transceiver 28 is disposed on electrical connecting pad 204 of built-up circuit layer structure 20 by conductive element 29; optical active region 281 on active surface 28a of optical transceiver 28 is opposite to hole 25, in other words, it is facing optical active region 221 of optical transceiver 22, which allows optical signals from optical transceivers 22 and 28 to be transmitted and received directly, thereby raising the electrical functionality of the circuit board structure.

The Fourth Preferred Embodiment

Figure 5:
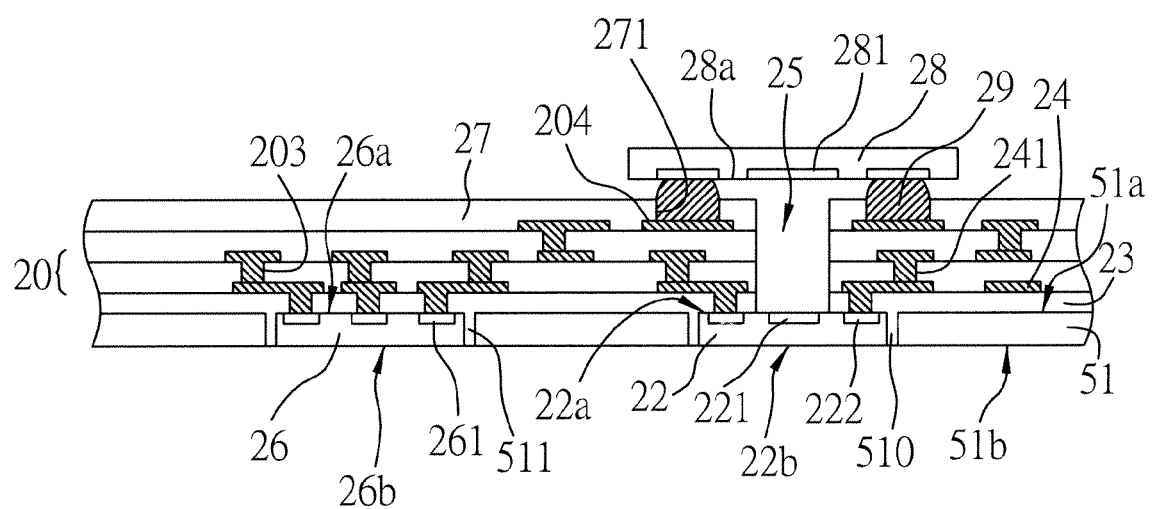
FIG. 5 is a schematic cross-sectional view illustrating the circuit board structure of integrated optoelectronic component of the present invention according to the fourth embodiment of the present invention.

FIGS. 5A and 5B are schematic cross-sectional views illustrating the circuit board structure of integrated optoelectronic component of the present invention according to the fourth embodiment of the present invention. This embodiment differs from the previous one in that the supporting structure 51 has a first surface 51a and a second surface 51b, and openings 510 and 511 are formed in supporting structure 51, which penetrate the first and the second surface, 51a and 51b respectively; the optical transceiver 22 and semiconductor component 26 are disposed in openings 510 and 511 of supporting structure 51 respectively.

A dielectric layer 23 and a circuit layer 24 are successively formed on the surface of supporting structure 51, on active surface 22a of optical transceiver 22, and on active surface 26a of semiconductor component 26; a built-up circuit layer structure 20 is formed on the surfaces of dielectric layer 23 and circuit layer 24, and an insulating protective 27 that functions as a soldermask layer is formed on the surface of built-up circuit layer structure 20 as well; another optical transceiver 28 is formed on the surface built-up circuit layer structure 20, and optical transceiver 28 is disposed on electrical connecting pad 204 of built-up circuit layer structure 20 by conductive element 29; optical active region 281 on active surface 28a of optical transceiver 28 is opposite to hole 25, in other words, it is facing optical active region 221 of optical transceiver 22, which allows optical signals from optical transceivers 22 and 28 to be transmitted and received directly, thereby raising the electrical functionality of the circuit board structure.

The Fifth Preferred Embodiment

Figure 6A:
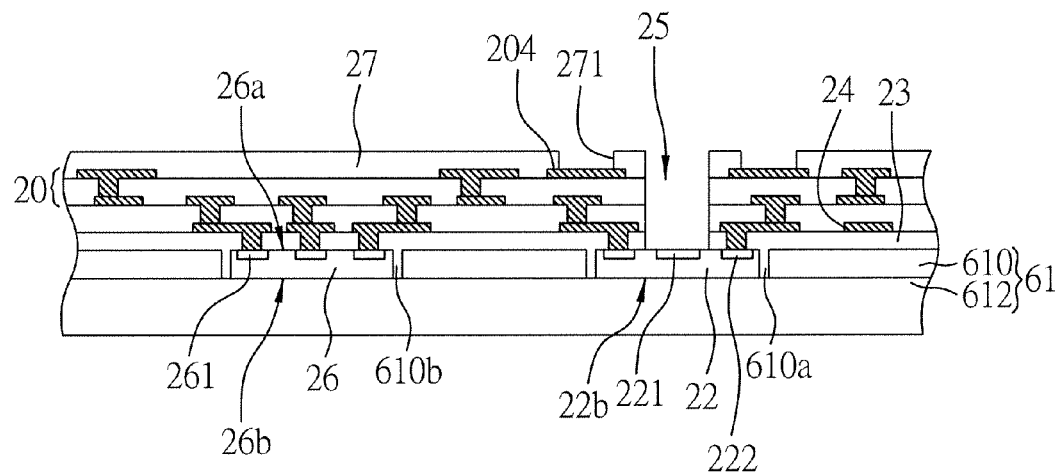
FIGS. 6A and 6B are schematic cross-sectional views illustrating the circuit board structure of integrated optoelectronic component of the present invention according to the fifth embodiment of the present invention.
Figure 6B:
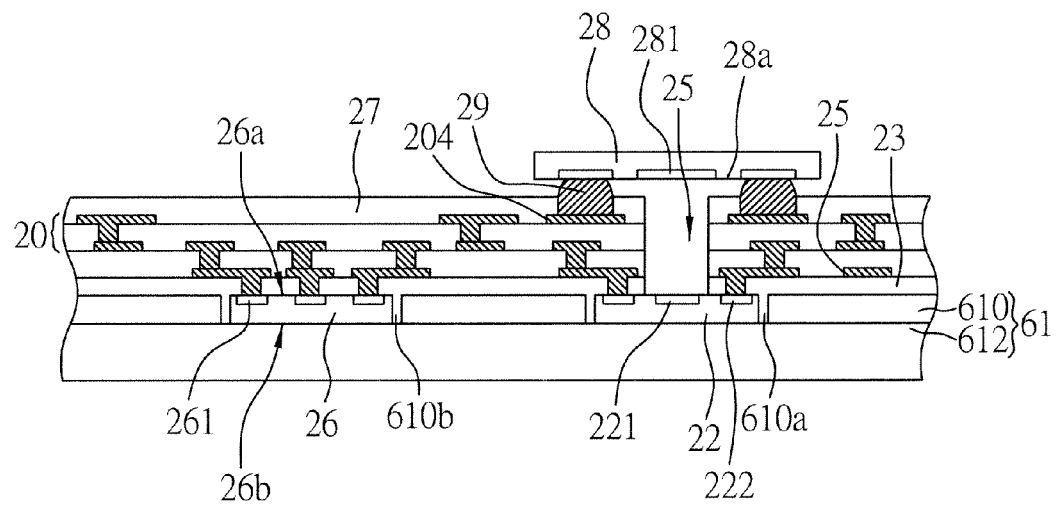

FIGS. 6A and 6B are schematic cross-sectional views illustrating the circuit board structure of integrated optoelectronic component of the present invention according to the fifth embodiment of the present invention.

As shown in FIG. 6A, this embodiment is basically identical to the embodiments mentioned before, the only difference is that in this embodiment, the supporting structure 61 is consisted of a first supporting board 610 and a second supporting board 612, wherein the first and the second supporting boards 610 and 612 can either be metal boards, ceramic boards, insulating boards, organic circuit boards, or the randomly stacked structure made of the previous materials. The first supporting board 610 has a plurality of through openings 610a and 610b, and the second supporting board 612 seals the other end of openings 610a and 610b, thereby making the inactive surface 22b of optical transceiver 22 and the inactive surface 26b of semiconductor component 26 dispose on the second supporting board 612 by an adhesive layer (not shown in the figure), so that optical transceiver 22 and semiconductor component 26 are disposed in openings 610a and 610b of the first supporting board 610 respectively. This is then followed by the formation of a dielectric layer 23 on the surface of the first supporting board 610, and the formation of circuit layer 24 in dielectric layer 23; circuit layer 24 is electrically connected to electrode pads 222 of optical transceiver 22 and electrode pads 261 of semiconductor component 26, and a through holes 25 is also formed in dielectric layer 23.

A built-up circuit layer structure 20 is formed on the surfaces of dielectric layer 23 and circuit layer 24, and an additional insulating protective layer 27 is formed on the outer surface of built-up circuit layer structure 20 in order to protect the circuit layer under its cover, a plurality of openings 271 are also formed in insulating protective layer 27 to expose the electrical connecting pads 204 on the outer surface of built-up circuit layer structure, wherein a hole 25 that penetrates dielectric layer 23 and built-up circuit layer structure 20 is formed in the position that faces the optical active region 221 on active surface 22a of optical transceiver 22, thereby exposing optical active region 221.

Referring to FIG. 6B, the surface of built-up circuit layer structure 20 is disposed with another optical transceiver 28, and optical transceiver 28 is disposed on electrical connecting pad 204 of built-up circuit layer structure 20 by conductive element 29; optical active region 281 on active surface 28a of optical transceiver 28 is opposite to hole 25, in other words, it is facing optical active region 221 of optical transceiver 22, which allows optical signals from optical transceivers 22 and 28 to be transmitted and received directly, thereby raising the electrical functionality of the circuit board structure.

The Sixth Preferred Embodiment

Figure 7:
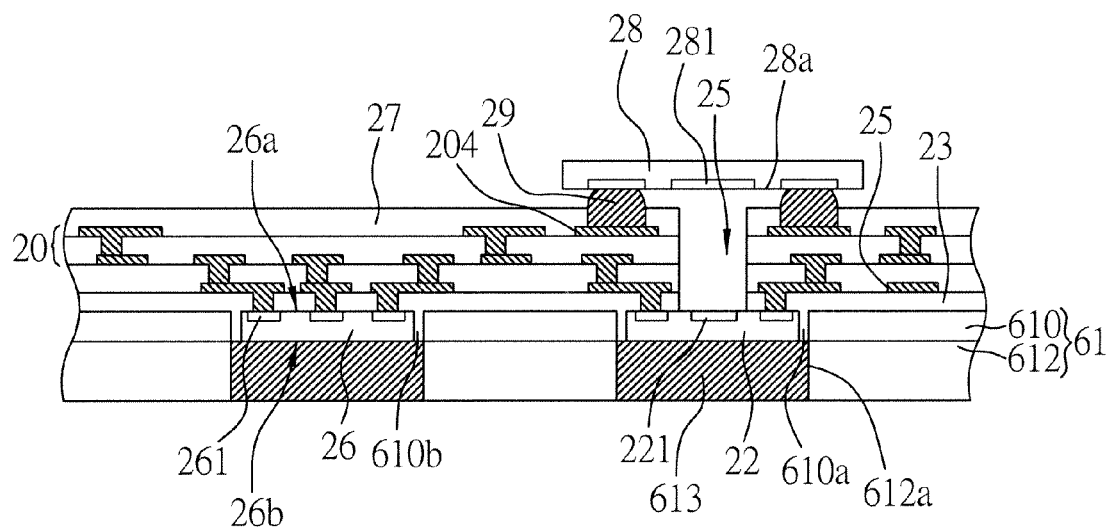
FIG. 7 is a schematic cross-sectional view illustrating the circuit board structure of integrated optoelectronic component of the present invention according to the sixth embodiment of the present invention.

FIG. 7 is a schematic cross-sectional view illustrating the circuit board structure of integrated optoelectronic component of the present invention according to the sixth embodiment of the present invention. It differs from the previous embodiment in that the first and the second supporting boards are either circuit boards or insulating boards, and an opening 612a is formed in the second supporting board 612, a heat slug 613 is also formed in opening 612a; the optical transceivers 22 and 28, as well as semiconductor component 26 are disposed on heat slug 613, so that the heat generated from running optical transceivers 22 and 28 or semiconductor component 26 can be dispelled outwards by heat slug 613, thereby raising the heat dissipation function of the circuit board structure of integrated optoelectronic component and protecting the components from getting damaged.

Therefore, in the circuit board structure of integrated optoelectronic component of the present invention, a supporting structure is integrated with optical transceiver first, then a single-layer or multi-layer circuit structure with holes is formed on the active surface of the optical transceiver, so that the circuits in the single-layer or multi-layer circuit structure can be electrically connected to the electrode pads of optical transceiver directly, and thus the optical active region of the optical transceiver is made opposite to the hole. As a result, a circuit board structure of integrated optoelectronic component that meets the demand of miniaturization regarding electronic devices can be produced, thus the integration of optoelectronic components can reduce signal loss during signal transmission, shorten conductive pathway, and decrease noises, thereby elevating the quality of optical and electrical signal transmission.

Moreover, in the circuit board structure of integrated optoelectronic component of the present invention, the two ends of a hole in single-layer or multi-layer circuit structure can be connected to two optical transceivers respectively, so that the optical active regions on the active surfaces of the two optical transceivers can face each other, thereby forming a modularized circuit board structure integrated with optoelectronic components, which in turn satisfies the constantly rising demands regarding the quality of electronic products.

In addition to that, in the circuit board structure of integrated optoelectronic component of the present invention, additional heat slugs or heat dissipation boards can be formed, so that optical transceivers or semiconductor components can be disposed on it, hence the heat generated from running the optical transceivers or semiconductor components can be directly dispelled outwards, thereby raising the heat dissipation efficiency of the circuit board structure of integrated optoelectronic component and protecting components from getting damaged.

The preferred embodiments described above only serve the purpose of explaining the principle and effects of the present invention, and are not to be used to limit the scope of the present invention. Anyone who is familiar with the art may modify and adjust the above-mentioned embodiments provided that he or she does not depart from the purpose and scope of the present invention. Therefore, the scope of the present invention should be covered by the claims listed in the following pages.

What is claimed is:

1. A circuit board structure of integrated optoelectronic component, which is consisted of:
   a supporting structure, which has a first surface and a second surface that is opposite to the first surface;
   an optical transceiver, which has at least one active surface and an inactive surface that is opposite to the active surface, the inactive surface of the optical transceiver is disposed on the first surface of the supporting structure, and the active surface of the optical transceiver has an optical active region and a plurality of electrode pads;
   a dielectric layer, which is formed on the first surface of the supporting structure and on the active surface of the optical transceiver;
   a circuit layer, which is formed on the surface of the dielectric layer, and the circuit layer is electrically connected to the electrode pads on the active surface of the optical transceiver by the conductive structure formed in the dielectric layer;
   at least a hole, which penetrates the dielectric layer in order to expose the optical active region on the active surface of the optical transceiver; and
   another optical transceiver that is disposed on the circuit layer, and an optical active region on at least one active surface of the another optical transceiver is opposite to the hole that penetrates the dielectric layer, thus it is facing the optical active region of the optical transceiver, allowing the optical transceiver and the another optical transceiver to transmit optical signal directly.

2. The circuit board structure of integrated optoelectronic component in claim 1, further comprising a hole filled with optical conductive material that penetrates the dielectric layer.

3. The circuit board structure of integrated optoelectronic component in claim 1, wherein the supporting structure can either be metal boards, ceramic boards, insulating boards, or organic circuit boards.

4. The circuit board structure of integrated optoelectronic component in claim 3, wherein the supporting structure is either a circuit board or an insulating board, and an opening is located on the supporting structure where it is opposite to the inactive surface of the optical transceiver, a heat slug is also formed in the opening.

5. The circuit board structure of integrated optoelectronic component in claim 1, wherein the supporting structure is a stacked structure selected from the group consisting of metal boards, ceramic boards, insulating boards, and organic circuit boards.

6. The circuit board structure of integrated optoelectronic component in claim 1, wherein the supporting structure has at least one opening that penetrates the first surface but not the second surface, and the inactive surface of the optical transceiver is disposed in the opening of the supporting structure.

7. The circuit board structure of integrated optoelectronic component in claim 1, wherein the supporting structure has at least one opening that penetrates the first surface and the second surface, and the optical transceiver is disposed in the opening of the supporting structure.

8. The circuit board structure of integrated optoelectronic component in claim 1, wherein the supporting structure is composed of a first supporting board and a second supporting board.

9. The circuit board structure of integrated optoelectronic component in claim 8, wherein the first supporting board is consisted of a first surface and a second surface that is opposite to the first surface.

10. The circuit board structure of integrated optoelectronic component in claim 9, wherein the second supporting board is composed of a first surface and a second surface that is opposite to the first surface; an opening that penetrates the first surface and the second surface, and the second surface of the second supporting board is disposed on the first surface of the first supporting board.

11. The circuit board structure of integrated optoelectronic component in claim 10, wherein the first supporting board is either a metal board, a ceramic board, an insulating board, or an organic circuit board.

12. The circuit board structure of integrated optoelectronic component in claim 10, wherein the first supporting board is either a metal board, a ceramic board, an insulating board, an organic circuit board, or the stacked structure made of the previous materials.

13. The circuit board structure of integrated optoelectronic component in claim 10, wherein the first and the second supporting boards are either circuit boards or insulating boards, and an opening is located on the first supporting board where it is opposite to the inactive surface of the optical transceiver, and a heat slug is also formed in the opening.

14. The circuit board structure of integrated optoelectronic component in claim 10, wherein the second supporting board is either a metal board, a ceramic board, an insulating board, or an organic circuit board.

15. The circuit board structure of integrated optoelectronic component in claim 10, wherein the second supporting board is either a metal board, a ceramic board, an insulating board, an organic circuit board, or the stacked structure made of the previous materials.

16. The circuit board structure of integrated optoelectronic component in claim 1, wherein the optical transceiver can either be laser diode (LD), light emitting diode (LED), vertical cavity surface emitting laser (VCSEL), photodiode (PD) or photo sensor.

17. The circuit board structure of integrated optoelectronic component in claim 1, wherein an additional insulating protective layer is further formed on top of the circuit layer, and openings are also formed in the insulating protective layer in order to expose the parts of the circuit layer that serve as electrical connecting pads.

18. The circuit board structure of integrated optoelectronic component in claim 1, further comprising a built-up circuit layer structure formed on the surface of the dielectric layer and the circuit layer, and the built-up circuit layer structure is also electrically connected to the circuit layer; wherein an additional insulating protective layer is formed on the circuit layer located on the outer surface of the built-up circuit layer structure, and openings are also formed in the insulating protective layer in order to expose the parts of the circuit layer that serve as electrical connecting pads.

19. The circuit board structure of integrated optoelectronic component in claim 18, further comprising another optical transceiver that is disposed on the electrical connecting pads of the built-up circuit layer structure; a hole is formed in the dielectric layer and the built-up circuit layer structure where it faces the optical active region on the active surface of another optical transceiver, which is also opposite to the optical active region of the optical transceiver.

20. The circuit board structure of integrated optoelectronic component in claim 19, further comprising a hole that penetrates the dielectric layer and the built-up circuit layer structure, and the hole is filled with optical conductive material.

21. The circuit board structure of integrated optoelectronic component in claim 1, further comprising at least a semiconductor component; the semiconductor component is disposed on the supporting structure, and the circuit layer is electrically connected to the electrode pads of the semiconductor component by the conductive structure formed in the dielectric layer.

22. The circuit board structure of integrated optoelectronic component in claim 21, wherein the semiconductor component is either an active component or a passive component.

* * * * *